United States Patent [19]
Sasaki et al.

[11] Patent Number: 5,245,300
[45] Date of Patent: Sep. 14, 1993

[54] INTERMEDIATE FREQUENCY FILTER HAVING A CERAMIC FILTER

[75] Inventors: Kanemi Sasaki, Miyagi; Mikio Takano, Ohme, both of Japan

[73] Assignee: Kokusai Electric Co., Ltd., Tokyo, Japan

[21] Appl. No.: 868,573

[22] Filed: Apr. 15, 1992

[30] Foreign Application Priority Data

Apr. 17, 1991 [JP] Japan .................................. 3-110858

[51] Int. Cl.[5] .............................................. H03H 9/00
[52] U.S. Cl. ..................................... 333/167; 333/186
[58] Field of Search ................................ 333/186–192, 333/167, 174, 175; 455/302, 311, 334, 339, 340

[56] References Cited

U.S. PATENT DOCUMENTS

| | | | |
|---|---|---|---|
| 2,929,031 | 3/1960 | Kosowsky | 333/190 |
| 3,359,512 | 12/1967 | Malinowski | 333/188 |
| 4,048,595 | 9/1977 | Vale | 333/189 |
| 4,060,776 | 11/1977 | Blinchikoff | 333/190 X |

OTHER PUBLICATIONS

Takami et al, "An Approximate Nyquist-transmission for QPSK digital Mobile Communications", IECE Technical Report No. RCS90-6, Jul. 1990.
Shimizu, "Narrow Band Low Distortion Receiver with Delay-Flat Ceramic filter ... system", IECE Technical Report No. CS84-98, pp. 67-72, Nov. 28, 1984.
Analysis and Synthesis of Transitional Butterworth-Thomson Filters and Bandpass Amplifiers, Mar., 1957, pp. 60-94, RCA Review.
Marconi Instrumentation, vol. 15 No. 1, Narrow Band Crystal Filter Design pp. 10-13, 1975.

Primary Examiner—Robert J. Pascal
Assistant Examiner—Seung Ham
Attorney, Agent, or Firm—Sixbey, Friedman, Leedom & Ferguson

[57] ABSTRACT

An intermediate frequency filter for an intermediate frequency used in the receiver section of a digital radio communications apparatus is composed of an amplitude-flat ceramic filter incorporating two ceramic resonators, a buffer means and a single tuning circuit having the center frequency thereof within the bandwidth of the amplitude-flat ceramic filter, all being connected in series with each other. The center frequency of the single tuning circuit and Q are adjusted to approximate the amplitude characteristic of the intermediate frequency filter to that of TBT filter ($0.4 \leq$ parameter $m \leq 1.0$).

5 Claims, 7 Drawing Sheets $$Q = \frac{\omega_0 L}{R + R_{OUT}}$$

$$Q = \omega_0 CR$$

INTERMEDIATE FREQUENCY FILTER HAVING A CERAMIC FILTER

BACKGROUND OF THE INVENTION a) Field of the Invention

The present invention relates to an intermediate frequency filter (will be referred to as "IF filter" hereinafter), and more particularly, to an IF filter using an amplitude-flat monolithic ceramic filter.

b) Prior Art Statement

In a linear modulation system used in digital radio communications, such as quadri-phase shift keying (QPSK), a digital signal having a wide band of spectrum, if modified as it is for radiation from the antenna, will result in an interfering radio wave to the surroundings. To eliminate the interfering radio wave component, the digital signal must be shaped to limit its spectral band without degradation of the information its carries. The digital signal is subject to pulse-shaping as passed through a low-pass filter of which the characteristic is defined by a roll-off function. It is well known that with the roll-off factor being 0.5 so that one half of the pulse-shaping is done by the transmitter while the other half is done by the receiver, a high quality of signal transmission can be ensured, the frequency can be actively utilized and the interference can be effectively suppressed.

The roll-off function determining the characteristic of the low-pass filter destined for the pulse-shaping is not any one which can be implemented when its degree is finite. An approximate Nyquist-transmission system has been proposed and has been proved to be effectively usable in this technical field, which uses as IF filter for a receiver a Transitional Butterworth Thomson (TBT) filter in which the transfer function is expressed with a rational function of which the degree is finite and which is approximate to the roll-off function. It was reported that with the roll-off factor of 0.5, the inter-sign interference can be made small when the TBT parameter m is set within a range of 0.4 to 1.0 in case the degree of the transfer function of an optimal IF filter is eight (cf. "Takami et al "An Approximate Nyquist-transmission for QPSK Digital Mobile Communications", IECE (Institute of Electronics and Communication Engineering of Japan) Technical Report No. RCS90-6").

The IF filter for a conventional receiver used in digital radio communications uses a delay-flat ceramic filter as described in the IECE Technical Report No. CS84-98 (Isao Shimizu "Narrow Band Low Distortion Receiver with Delay-Flat Ceramic Filter for 800 MHz Band Mobile Radio System", pp. 67–72). The characteristics of a ceramic filter incorporating two resonators are shown in Table below. The table shows the results of comparison among four types of commercially available ceramic filters each having a center frequency of 10.7 MHz and a 3-dB bandwidth of 230 kHz. They are listed herein in the order from the poorest delay flatness (top) to the best one (bottom). The upper two are of amplitude-flat types, while the lower two are of delay-flat types. In the conventional receiver, a plurality of delay-flat ceramic filters is used as connected to each other in a ladder form since their characteristic can be converted to that of TBT filter. As shown, however, the better the delay-flatness of the ceramic filter, the larger that insertion loss becomes. Namely, the IF filter using the conventional delay-flat ceramic filter is disadvantageous in that the dynamic range of the IF stage is narrow.

TABLE

| | Ceramic Filter Characteristics | |
|---|---|---|
| Delay flatness | Delay deviation (μsec) | Insertion loss (dB) |
| x | 1.4 | 3.0 |
| ↓ | 0.8 | 4.5 |
| ↓ | 0.4 | 9.0 |
| o | 0.1 | 10.5 |

Further, when manufacturing a ceramic filter having a delay flatness, it is necessary to adjust the oscillation frequency of each ceramic oscillator, which will cause the yield of production to be reduced at the time of mass production. This will also raise the manufacturing costs of delay-flat ceramic filter, and thus those of receiver, which will also be an obstacle to the widespreading of digital mobile communications.

Furthermore, since the conventional IF filter has used therein in a ladder form a plurality of delay-flat ceramic filters each incorporating two resonators, the IF filter itself cannot be designed compact and thus it is not suitably usable in a small receiver.

SUMMARY OF THE INVENTION

The present invention has an object to overcome the above-mentioned drawbacks of the prior art by providing an IF filter using a ceramic filter having a small insertion loss, and of which the dynamic range is improved.

The present invention has another object to provide an IF filter using an inexpensive ceramic filter and which thus can be produced with reduced manufacturing costs.

The present invention has still another object to provide a compact IF filter.

The above objects of the present invention can be attained by providing an IF filter comprising an amplitude-flat ceramic filter having two resonators, a buffer means, and a single tuning circuit, both connected in series with the ceramic filter. The resonant frequency and Q of the single tuning circuit are adjusted for the amplitude characteristic of the IF filter to be approximate to that of the TBT preceding filter ($0.4 \leq$ TBT parameters $m \leq 1.0$).

Since the IF filter according to the present invention uses an amplitude-flat ceramic filter, its insertion loss is small and dynamic range is improved. Also, the amplitude-flat ceramic filter can be produced with low costs since it can be mass-produced because its kinds of elements used are small in number and thus it can be easily constructed. Hence, using this amplitude-flat ceramic filter, an IF filter can be manufactured with less costs. Further, since it can be constructed with a single such ceramic filter, the IF filter can be designed compact.

DETAILED DESCRIPTION OF THE PREFERRED EMBODIMENTS

Figure 1A:
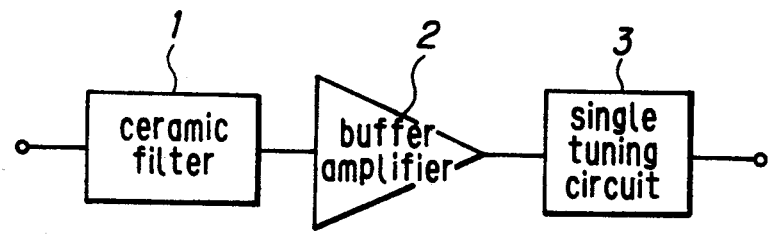
FIG. 1(A) is a block diagram of an embodiment of the IF filter according to the present invention.

Referring now to Figure, the present invention will be discussed below. As seen from FIG. 6 which is a block diagram of the receiver section of a digital radio communications apparatus, a radio frequency (will be referred to as "RF" hereinafter) signal received by an antenna 10 is amplified by an RF amplifier 11 and supplied to a frequency mixer 13 where it will be mixed with an output from a first local oscillator 12 into a first IF signal. This first IF signal is amplified in a first IF amplifier 14 and supplied to a frequency mixer 16 where it will be mixed with an output from a second local oscillator 15 into a second IF signal. This second IF signal is further amplified in a second IF amplifier 17 and then demodulated in a demodulator 18.

The second IF amplifier 17 comprises an IF filter 20 which shapes the second IF signal and an amplifier 21 which amplifies the signal having passed through the IF filter 20 and supplies the signal thus amplified to the demodulator 18.

Figure 1B:
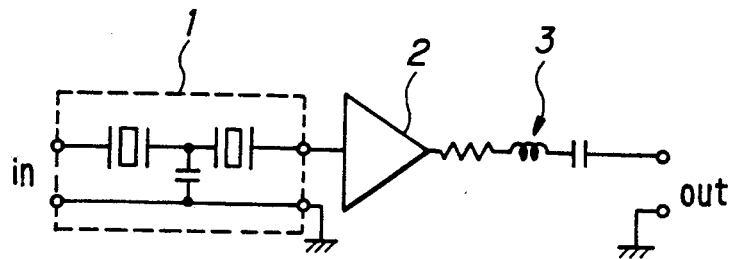
FIG. 1(B) is a detail circuit diagram of the IF filter shown in FIG. 1(A)
Figure 1C:
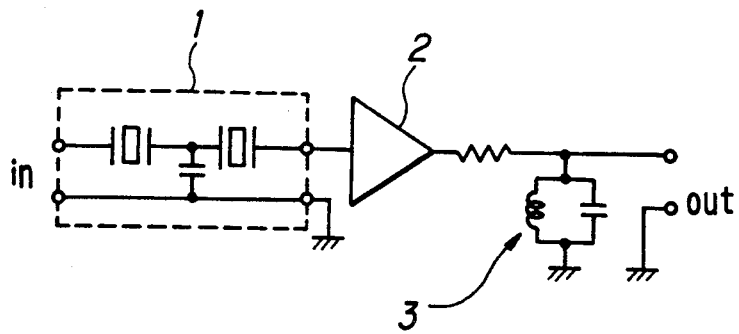
FIG. 1(C) is also a detail circuit diagram of the IF filter according to another embodiment of the present invention.
Figure 6:
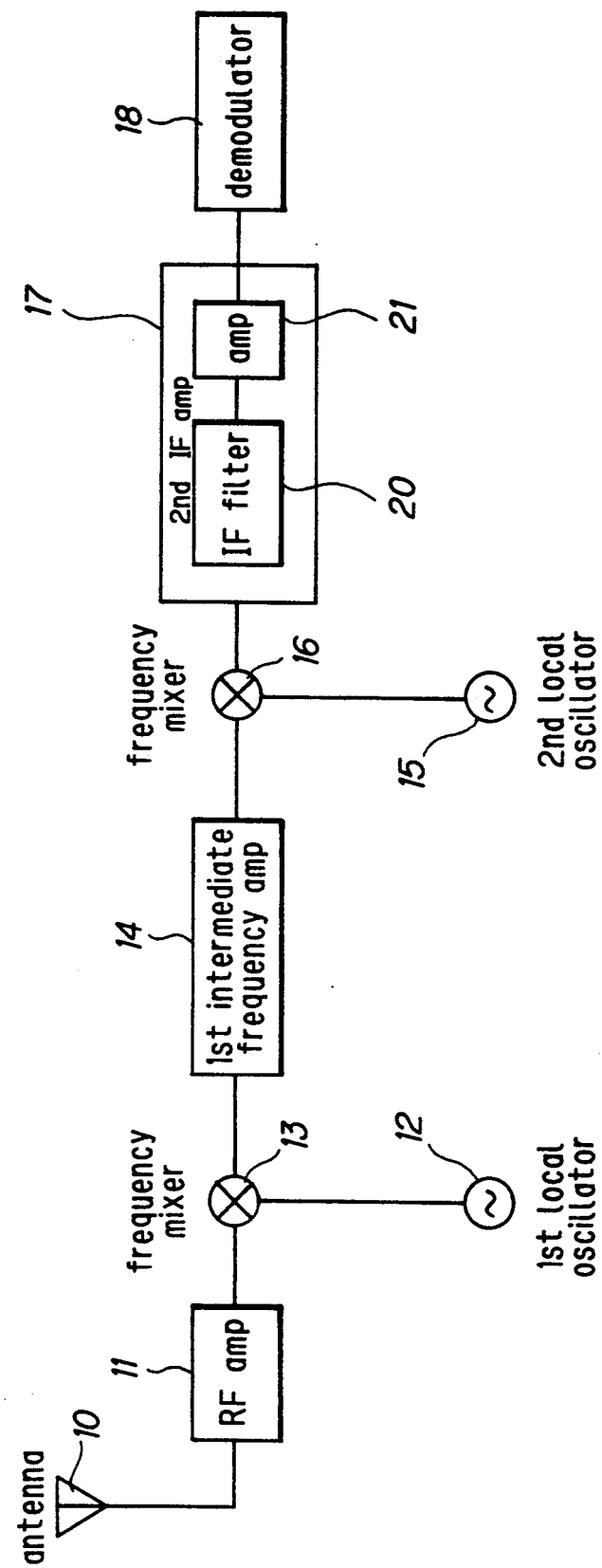
FIG. 6 is a block diagram of the receiver section of a digital radio communications apparatus.

FIG. 1(A) is a block diagram of the IF filter 20 shown in FIG. 6. As seen, the IF filter according to the present invention comprises an amplitude-flat ceramic filter 1 having two resonators incorporated therein, a buffer amplifier 2, and a single tuning circuit 3, both connected in series to the ceramic filter 1. FIG. 1(B) shows an IF filter in detail. According to this embodiment, a series resonant circuit is used as the single tuning circuit 3. FIG. 1(C) is a detail circuit diagram of an IF filter according to another embodiment of the present invention. As seen, this IF filter uses a parallel resonant circuit as the single tuning circuit 3. As mentioned above, assume that the roll-off factor is 0.5 and the pulse shaping is shared fifty-fifty by the transmitter and receiver. In the receiver, the roll-off characteristic is determined by the transfer function of the IF filter 20 (of 10.7 MHz in center frequency) in the second IF amplifier 17 (FIG. 6). A receiver of a digital radio communications system of a $\pi/4$ deviation QPSK modulation type and having a transmission rate of 320 kbps will be described hereinbelow.

In this digital radio communications system, the amplitude characteristic of the IF filter is approximated, in a bandwidth of 10.7 MHz±100 kHz where 99% of the energy of transmitted wave spectrum is concentrated, to that in a range of TBT parameter m=0.4 to 1.0 of the TBT filter of which the degree of transfer function is eight, thereby permitting to minimize the degration of the eye-pattern of the demodulated signal. For this purpose, the single tuning circuit is adjusted to make the characteristic of the IF filter 20 approximate to the above-mentioned amplitude characteristic of the TBT filter.

Next, the principle of approximating the amplitude characteristic of the IF filter to that of the TBT filter will be discussed below.

Figure 2:
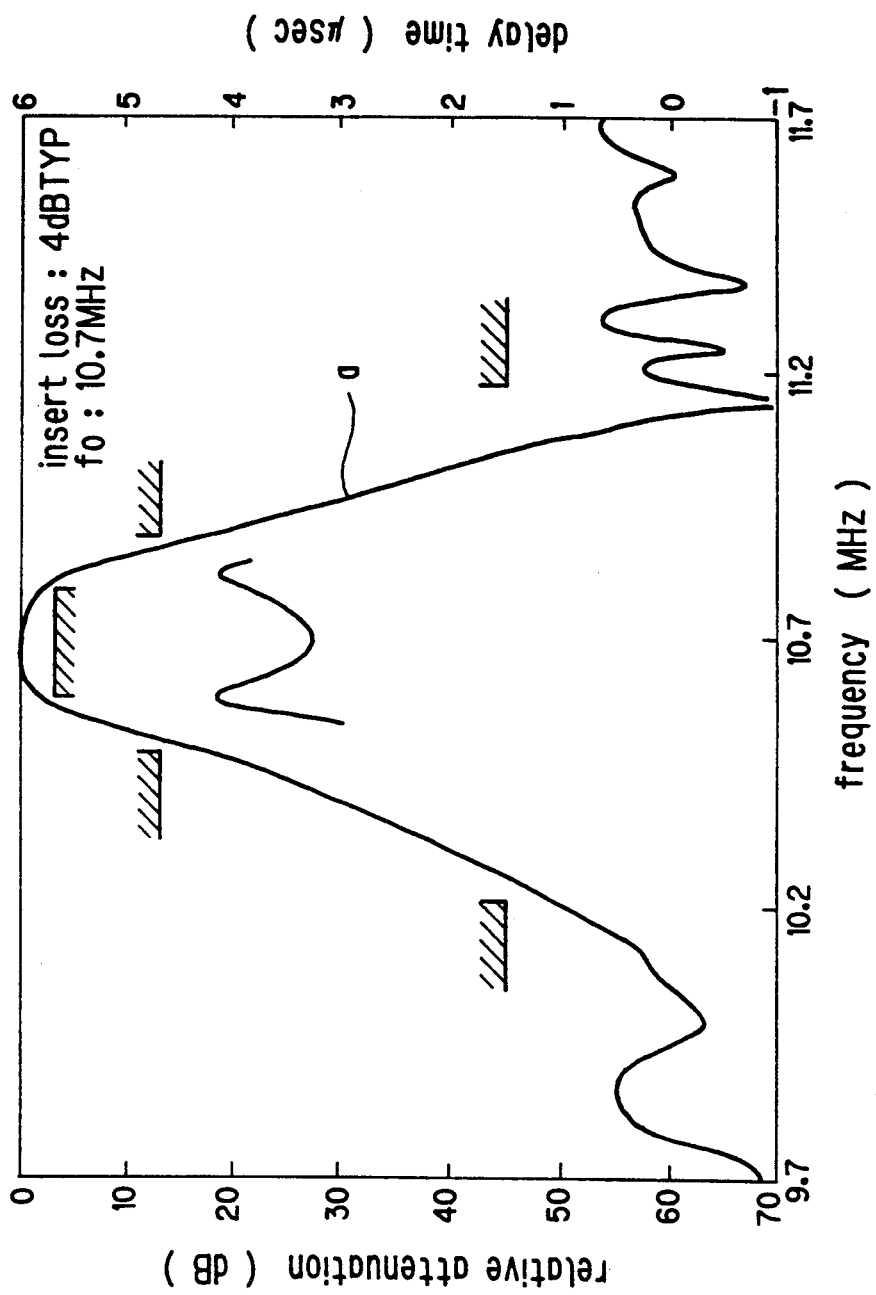
FIG. 2 graphically shows the characteristics measured of the amplitude-flat ceramic filter.
Figure 3A:
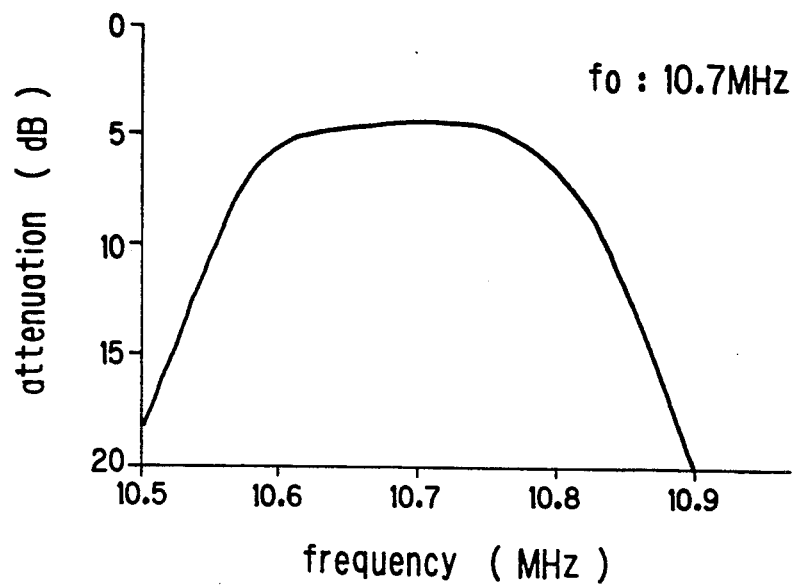
FIG. 3(A) graphically shows the amplitude characteristic determined through calculation based on the characteristics shown in FIG. 2 and an equivalent circuit of the amplitude-flat ceramic filter.
Figure 3B:
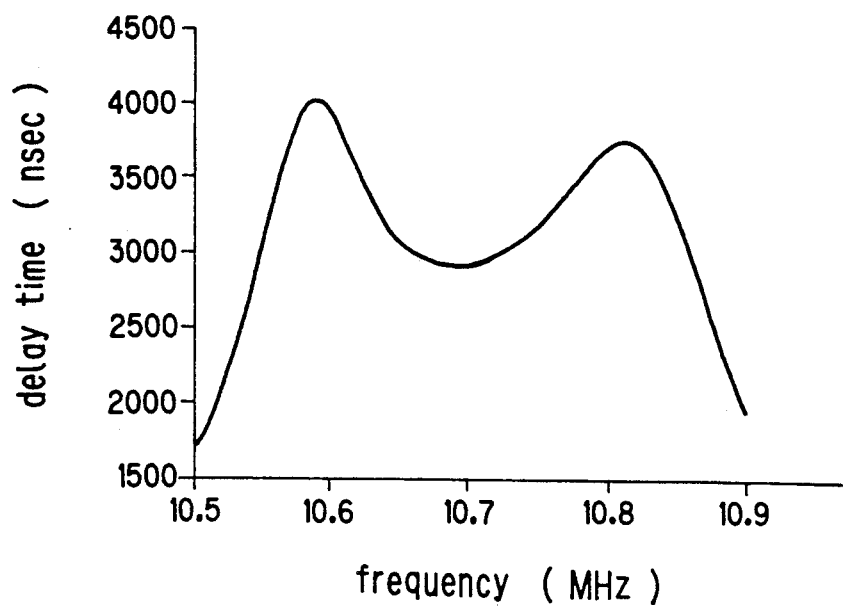
FIG. 3(B) graphically shows the delay characteristic determined through calculation based on the characteristics shown in FIG. 2 and an equivalent circuit of the amplitude-flat ceramic filter.

FIG. 2 shows the characteristics of the amplitude-flat ceramic filter incorporating two resonators. The amplitude-flat ceramic filter has an insertion loss of about 4 dB when the bandwidth is 3 dB. The insertion loss is smaller than that of the delay-flat ceramic filter when the bandwidth is the same. The hatched portions in FIG. 2 are the requirements the filters used in radio communications must satisfy. The amplitude characteristic a of the amplitude-flat ceramic filter meets the requirements. FIGS. 3(A) and 3(B) show the amplitude and delay characteristics, respectively, calculated based on the amplitude characteristic a in FIG. 2 and the equivalent circuit of the amplitude-flat ceramic filter.

Though the amplitude characteristic of the amplitude-flat filter satisfies the requirements, the ceramic filter cannot be used as it is in place of the TBT filter. According to the present invention, the single tuning circuit 3 is connected to the amplitude-flat ceramic filter 1 by means of a buffer amplifier 2 as shown in FIG. 1, and the values of the single tuning circuit elements are adjusted to approximate the amplitude characteristic of the ceramic filter to that of the TBT filter. In this embodiment, the buffer amplifier 2 is used as a buffer means between the amplitude-flat ceramic filter 1 and single tuning circuit 3, but this buffer means may not be any buffer amplifier. In case the dynamic range permits it, an attenuator may be inserted in place of the buffer amplifier. What the buffer means should be depends upon the circuit configuration and the easiness in forming the second IF amplifier shown in FIG. 6 into an IC. In the embodiment shown in FIG. 1, the ceramic filter, buffer means and the single tuning circuit are connected in this order, but it is of course that the IF filter may be composed with the ceramic filter and single tuning circuit swapped in position for each other.

Figure 7A:
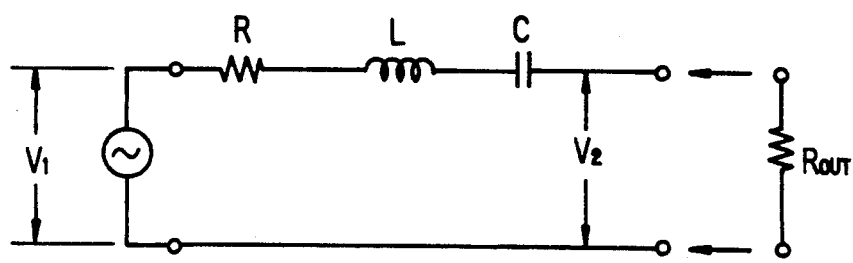
FIG. 7(A) is an equivalent circuit diagram of the IF filter shown in FIG. 1(B)
Figure 7B:
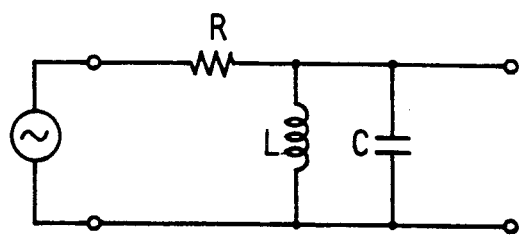
FIG. 7(B) is an equivalent circuit diagram of the IF filter shown in FIG. 1(C).

FIG. 7(A) is an equivalent circuit diagram of the IF filter shown in FIG. 1(B), and FIG. 7(B) is an equivalent circuit diagram of the IF filter shown in FIG. 1(C). Assume that the voltage delivered from the amplitude-flat ceramic filter and supplied through the buffer amplifier to the single tuning circuit is V1 and the voltage delivered from the single tuning circuit is V2. In both the equivalent circuits shown in FIGS. 7(A) and 7(B), the transfer function H(P) is as follows:

$$H(P) = V2(P)/V1(P) = (f_0 \cdot P/Q)/(P^2 + f_0 \cdot P/Q + f_0^2)$$

where $P = jf$ and $f_0 = \frac{1}{2}\pi\sqrt{LC}$.

When the values of the single tuning circuit elements are adjusted, the characteristic of the transfer function H(P) changes. For example, when the resistor R is adjusted, Q changes, For example, by adjusting the inserted depth of the center core in the coil to change the inductance L and capacitance C, the center frequency $f_0$ changes. Also, when a parallel resonant circuit is used as the single tuning circuit, Q changes as the capacitance C is adjusted.

Figure 5A:
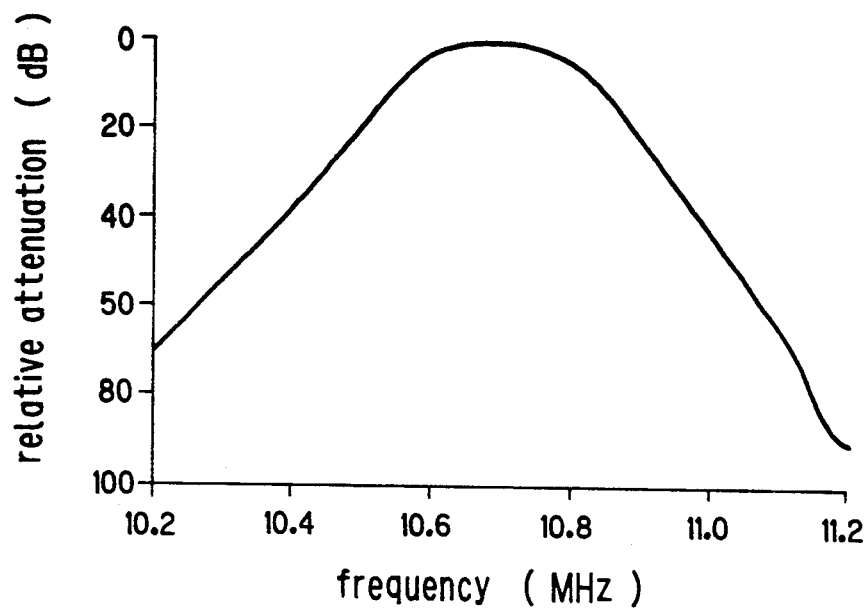
FIG. 5(A) graphically shows the amplitude characteristic of the IF filter according to the present invention.
Figure 5B:
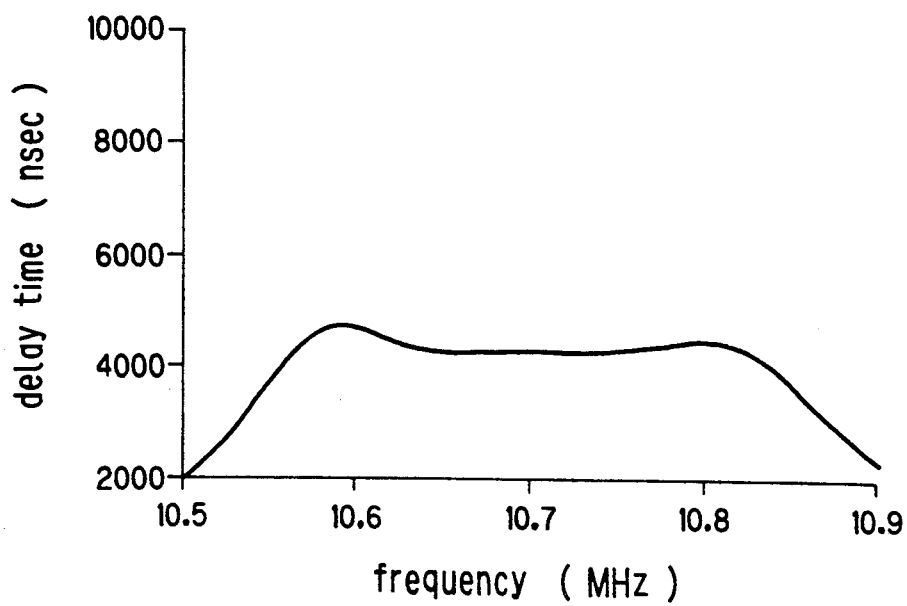
FIG. 5(B) graphically shows the delay characteristics of the IF filter according to the present invention.

FIGS. 5(A) and 5(B) show the amplitude and delay characteristics, respectively, of the transfer function H(P) when the single tuning circuit is adjusted for $f_0$ to be 10.7 MHz and Q to be 40. The deviation of the delay characteristic of the amplitude-flat ceramic filter alone is 1 μsec (4,000 to 3,000 nsec) with the center frequency in a range of 10.7 MHz±100 kHz. On the contrary, the single tuning circuit can be added to the amplitude-flat ceramic filter and adjusted to improve the deviation of the delay characteristic to 0.5 μsec as shown in FIG. 5(B).

Figure 4:
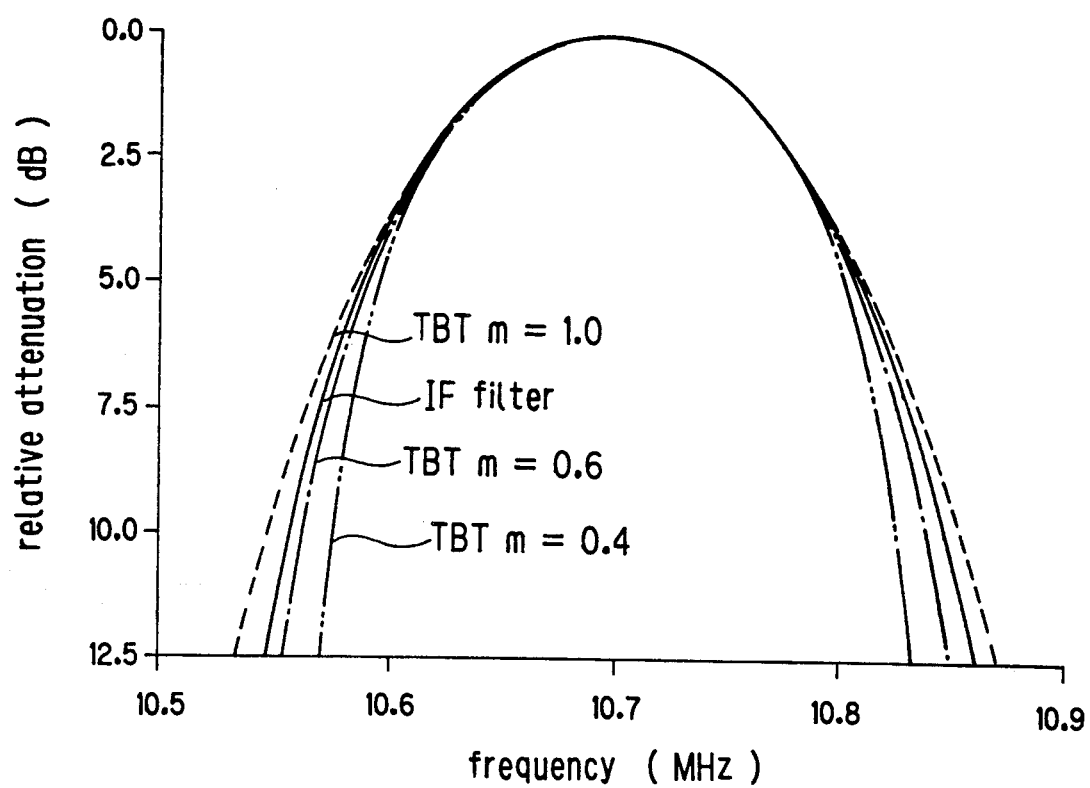
FIG. 4 shows the comparison between the amplitude characteristic (indicated with solid line) of the IF filter according to the present invention and that of the TBT filter of which the degree of transfer function is eight (TBT parameter m=0.4, 0.6 and 1.0)

Also, the amplitude characteristic can be improved. The solid line in FIG. 4 shows, as enlarged, the range of 10.7 MHz±100 kHz of the amplitude characteristic shown in FIG. 5(A). FIG. 4 also shows the amplitude characteristics of the TBT filter at TBT parameter m values of m=0.4, m=0.6 and value m=1.0. As seen from FIG. 4, the amplitude characteristic of the IF filter 20 used in the embodiment is approximated to that of the TBT filter in a required range (10.7 MHz±100 kHz) in the second IF amplifier with an error which is within 3%.

The resonant circuit of Q=40 can be implemented with a commercially available variable chip coil of 5 square mm. Even if the characteristic of the amplitude-flat ceramic filter varies due to its manufacturing error, the IF filter can keep a same characteristic through fine adjustment of the single tuning circuit. A single ceramic filter is used and the single tuning circuit is a 5 square-mm coil. Thus, the manufacturing costs can be reduced and the IF filter can be designed compact as a whole. Hence, the IF filter is suitably usable in a portable-type mobile communications apparatus, but the present invention is not limited only to this application. The IF filter according to the present invention can be used in ordinary digital radio communications apparatuses.

What is claimed is:

1. An intermediate frequency filter having an amplitude characteristic, comprising, as connected in series with each other, a single amplitude-flat ceramic filter having two ceramic resonators, a buffer means and a single tuning circuit of which the center frequency is within the bandwidth of said amplitude-flat ceramic filter;

said buffer means being disposed between said ceramic filter and single tuning circuit;

said amplitude characteristic being made approximate to that of a TBT filter by adjusting said single tuning circuit.

2. An intermediate frequency filter as set forth in claim 1, wherein said TBT filter, the amplitude characteristic of which is approximated, is a TBT filter having a TBT parameter m within a range of 0.4 to 1.0.

3. An intermediate frequency filter as set forth in claim 2, wherein said center frequency is 10.7 MHz.

4. An intermediate frequency filter as set forth in claim 3, forms part of a receiver section of a digital radio communications apparatus.

5. An intermediate frequency filter as set forth in claim 3, forms part of a receiver section of a digital mobile communications apparatus.

* * * * *